United States Patent [19]

Gittinger

[11] 3,931,578
[45] Jan. 6, 1976

[54] MULTIPLE FREQUENCY BAND RECEIVER TUNER SYSTEM USING SINGLE, NON-BANDSWITCHED LOCAL OSCILLATOR

[75] Inventor: Norman C. Gittinger, Schenectady, N.Y.

[73] Assignee: General Electric Company, Schenectady, N.Y.

[22] Filed: Dec. 26, 1973

[21] Appl. No.: 428,074

[52] U.S. Cl. .............. 325/461; 325/434; 325/459; 325/460
[51] Int. Cl.² ............................................. H04B 1/16
[58] Field of Search .......... 325/345, 368, 370, 431, 325/434, 435, 438, 452, 453, 458, 459–461, 464, 465, 491; 334/18

[56] References Cited
UNITED STATES PATENTS
2,902,598  9/1959  Hills ................................... 325/453
3,264,566  8/1966  Kaufman et al. ................... 325/465

*Primary Examiner*—Benedict V. Safourek
*Assistant Examiner*—Marc E. Bookbinder
*Attorney, Agent, or Firm*—Stephen B. Salai; Joseph T. Cohen; Jerome C. Squillaro

[57] ABSTRACT

A single, non-bandswitched local oscillator in a UHF, VHF, CATV television receiver tuner system is employed with frequency multiplying and, or frequency dividing to obtain the required IF frequencies. The tuner operates in a double frequency conversion mode at UHF frequency with a tuned VHF RF amplifier dual functioning as a UHF IF amplifier. A UHF preselector and the VHF RF amplifier are gang-tuned with the local oscillator. The tuner operates in a single frequency conversion mode at VHF and CATV frequencies, and one of the local oscillator frequency dividing or doubling stages is utilized to distinguish the VHF low band from the high VHF-CATV tuning band.

21 Claims, 2 Drawing Figures

MULTIPLE FREQUENCY BAND RECEIVER TUNER SYSTEM USING SINGLE, NON-BANDSWITCHED LOCAL OSCILLATOR

My invention relates to a multiple frequency band receiver tuner system, and in particular, to a television receiver tuner operating in a double frequency conversion mode at UHF frequencies and utilizing a single non-bandswitched local oscillator with frequency multiplication and division to derive the required IF frequencies.

UHF television tuners presently employ a high Q preselector and UHF local oscillator to obtain single (frequency) conversion from the UHF RF to the receiver IF frequency. Very high Q is required in the tuned circuits to insure oscillator stability and rejection of local oscillator and image frequencies in the preselector stage. This Q is difficult to obtain when utilizing electronic tuning means such as varactors or digital capacitors in place of the conventional mechanical tuning capacitors primarily due to the higher electrical losses therein resulting from their solid state fabrication. Thus, a television tuning system is needed which reduces these high Q requirements to values which are practical for electronic tuning elements.

In addition, television receivers of the near future will be required to tune all frequencies used in cable television (CATV) systems. These CATV frequencies span the frequency band of 120–270 MHz, and thus a system is required to tune this frequency range and UHF frequencies (470–890 MHz) as well as the VHF frequencies (54–216 MHz) in an efficient and optimum manner.

Prior art television tuner systems have employed the double (frequency) conversion principal but, in general, such systems utilize two completely independent local oscillators for the two (UHF and VHF) converter stages. Oscillator stability and spurious responses are typical problems associated with such prior art double conversion systems. Television set top converters for UHF and CATV bands are well known, and these units form double or triple conversion systems when used with a VHF television receiver. The first intermediate frequency (IF) of these above-identified tuning systems is, in general, a fixed frequency, and no component serves the dual function of a UHF IF amplifier and VHF-CATV RF amplifier as in my invention.

However, several prior art patents are related to my invention in the following manner. U.S. Pat. No. 2,787,703 to Lubben discloses a television tuner using a single oscillator with the third harmonic thereof being utilized at UHF. However, Lubben's system uses only single conversion for both the VHF and UHF and there is no tunable first IF stage in his system as the basic distinguishing features from my tuning system. U.S. Pat. No. 3,662,271 to Nakanishi discloses the use of the VHF IF amplifier stage and mixer stage as cascaded IF amplifier stages when receiving a UHF television signal to thereby obtain an additional IF gain for UHF reception. However, the Nakanishi system utilizes two separate oscillators as one of the major distinctions from my tuning system U.S. Pat. No. 3,324,396 to Schneider discloses a single oscillator and a plurality of multipliers to provide different frequencies for different mixer stages in a multiple conversion transceiver. However, the Schneider system does not provide a dual use for his first IF amplifier and obtains only a single frequency band receiver even though the system is of the dual conversion type. U.S. Pat. No. 2,505,043 to Guanella discloses a single oscillator producing a plurality of mixer frequencies by means of various frequency multipliers obtaining multiples of the basic oscillator frequency. However, the Guanella system does not provide for dual use of the first IF or for multiple frequency bands. Finally, U.S. Pat. No. 1,647,609 to Cotter is similar to the Schneider patent in that it discloses a multiple conversion receiver with harmonically related local oscillators and tunable IFs. Again, however, the Cotter system does not provide for dual use of the first IF, i.e., does not utilize the high frequency band IF amplifiers as RF amplifiers in the lower frequency bands. In summary, the prior art patents disclose the general concept of using a single oscillator to provide a plurality of different frequencies to effect mixing of frequencies in different frequency bands and to produce a single IF output signal. Also, the prior art patents disclose the use of a portion of the VHF circuitry in a television tuner for processing a UHF signal; however, the prior art does not teach the use of a single local oscillator to provide a frequency to a UHF mixer to convert the UHF signal to a VHF frequency whereby it can be processed through a VHF tuner and mixed as though it were a VHF signal with a second frequency from the same local oscillator to produce an output signal at a constant IF frequency. Thus, my invention is novel over the prior art in that there is a dual use of a tuned VHF RF amplifier as a tunable first IF amplifier stage in a UHF double conversion receiver, multiple frequency bands are received, frequency multiplication of the single oscillator output is utilized for reception of UHF, and frequency division of the oscillator output for the VHF low band.

Therefore, one of the principal objects of my invention is to provide an improved receiver tuner system having a double conversion mode of operation.

Another object of my invention is to provide the tuner system with a single non-bandswitched local oscillator which is employed with frequency multiplying and, or dividing to obtain the required IF frequencies in the various received frequency bands.

A further object of my invention is to provide the tuner system as an all frequency television tuner in a UHF, VHF, CATV receiver.

A still further object of my invention is to obtain dual use of the VHF RF amplifier in the tuner as a tunable first IF amplifier in the UHF portion of the receiver.

Another object of my invention is to provide an improved television tuner system which has reduced Q requirements in the UHF section to values practical for use with electronic tuning elements.

Another object of my invention is to provide the tuner system having a single conversion mode of operation at VHF and CATV frequencies.

Briefly summarized, and in accordance with the objects of my invention, I provide a multiple frequency band receiver tuner system adapted to operate in a double frequency conversion mode and employing a single non-bandswitched local oscillator. In a television receiver embodiment of my tuner system, frequency multiplying and, or frequency dividing stages are connected to the output of the local oscillator to provide the UHF and VHF-CATV mixer circuits with appropriate local oscillator frequencies to develop the desired IF frequencies. The received UHF signal is applied to a tunable UHF preselector and RF amplifier and the output thereof is connected to a first input of the UHF mixer. The doubled frequency output of the local oscillator is applied to a second input of the UHF mixer, and the UHF IF frequency at the output thereof is in the frequency band used for CATV signals. The output of the UHF mixer is selectively connected to the input of a tunable VHF-CATV RF amplifier to obtain dual use thereof as a tunable UHF IF amplifier. The output of the VHF-CATV RF amplifier is connected to a first input of the VHF-CATV mixer, and the output of the local oscillator (for the CATV and VHF high bands), or a frequency divided-by-two output thereof (for the VHF low band) is selectively connected to the second input of the VHF-CATV mixer. The output of the VHF-CATV mixer includes the receiver fixed IF frequency. The UHF preselector, tuned VHF-CATV RF amplifier and local oscillator are gang-tuned and the tuner operates in the double conversion mode at UHF frequency and in the single conversion mode a VHF and CATV frequencies. The tuned VHF-CATV RF amplifier is internally bandswitched in the above-described embodiment for operation in the VHF low band or the CATV and VHF high bands. In a second embodiment, the VHF low band signals are applied to a third mixer circuit and the upper sideband of the mixer output is selected, which is the frequency range of the CATV band, and applied to the tuned VHF-CATV RF amplifier that now is not internally bandswitched since its frequency tuning range is limited to the CATV and VHF high bands.

The features of my invention which I desire to protect herein are pointed out with particularity in the appended claims. The invention itself, however, both as to its organization and method of operation, together with further objects and advantages thereof, may best be understood by reference to the following description taken in connection with the accompanying drawing wherein:

Figure 1:
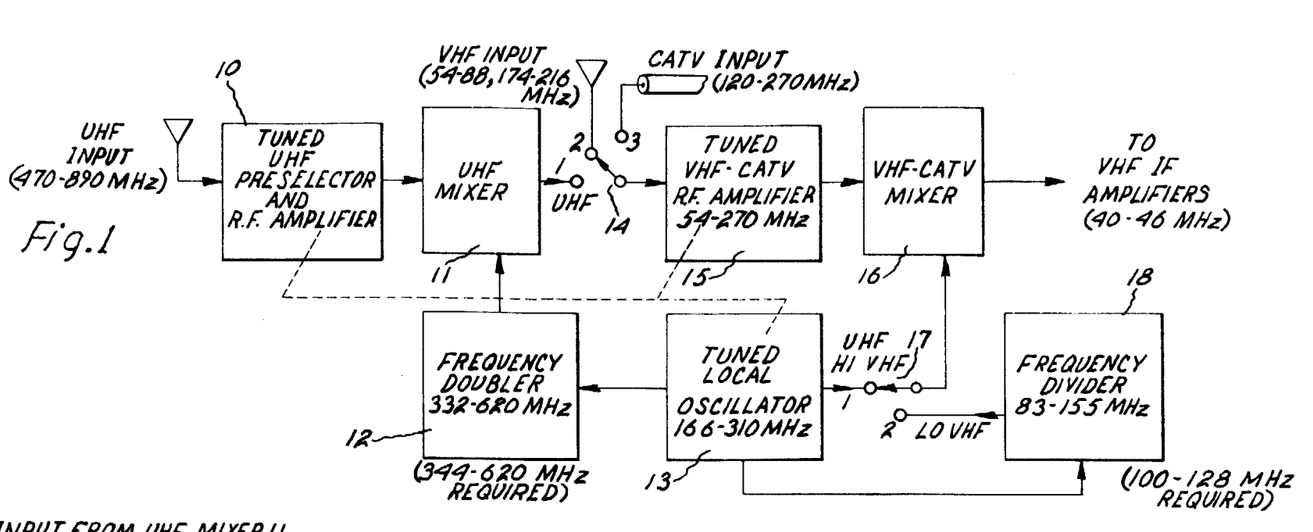
FIG. 1 is a block diagram of a frist embodiment of my television tuner system.

Referring now to FIG. 1, there is shown a tuner system which is applicable to any multiple frequency band, double conversion receiver system wherein double conversion is defined as a first conversion from the received signal radio frequency (RF) to a first intermediate frequency (IF) followed by a second frequency conversion from the first IF frequency to a second, and generally lower, IF frequency. Although my system is applicable to any multiple frequency band receiver tuning system employing such double conversion principle, it will be specifically described with reference to a tuner for a UHF, VHF, CATV television receiver. The tuning system may be manufactured with vacuum tube or transistor devices, and is especially appropriate for manufacture as a solid state tuner utilizing electronic tuning means such as varactors and digital capacitors instead of the conventional mechanical tuning capacitors.

The signal in the highest frequency band for which my tuning system is designed, is applied, after being received by a suitable antenna, cable or other means, to an input of a tunable preslector and R.F. amplifier circuit 10 which in the case of a television tuner system is a tuned UHF preselector and R.F. amplifier. The R.F. amplifier portion of circuit 10 need not be tunable, and in such case would be a broad band amplifier. Although the tuned preselector-amplifier 10 is not an essential component in my tuning system, it would generally be utilized in order to reduce signal interference problems as well as to provide amplification of the desired input signal. The tuned preselector-R.F. amplifier 10 may typically consist of a UHF amplifying transistor and input and output tuning elements employing solid state tuning capacitors.

The output of the tuned preselector-R.F. amplifier 10 is connected to a first input of a first input of a first mixer circuit 11. The second input to mixer 11 is a suitable local oscillator frequency for developing at the output of mixer 11, among other signals, a desired first IF frequency signal (which is selected and amplifier in tuned circuit 15) and is included within the frequency band of one or more other lower frequency band input signals that alternately with the highest frequency band signal may be introduced into the tuner system beyond the mixer stage 11. The second input to mixer 11 can be directly from the output of a tunable local oscillator, however, in the particular preferred embodiment illustrated in FIG. 1, the input is connected from the output of a frequency multiplier circuit 12 which in the television tuner application doubles the frequency of a tunable local oscillator 13 connected to the input of the frequency doubler. The mixer circuit 11 is of conventional design typically consisting of one or more solid-state diodes and coupling transformers functioning as an unbalanced, single balanced or doubly balanced mixer, and in the television tuning system, mixer 11 is the UHF mixer. The frequency multiplier (doubler) circuit 12 is also of conventional type and typically includes two diodes or transistors connected in a full wave or push-pull doubler configuration. The tuned local oscillator circuit 13 typically may be a transistor oscillator employing a stable (preferably solid-state) electronically tunable tank circuit for its frequency selection means.

The output of mixer 11 is connected to a first position (1), designated UHF, of a multi-position switch 14. Signals in lower frequency bands than that applied to circuit 10 are applied to one or more other positions of switch 14. Thus, in the television tuner, the VHF signals are applied to a second position (2) of switch 14 and the CATV signals are applied to a third position (3). The fixed end of the selector arm of switch 14 is connected to the input of a tunable RF amplifier stage 15 having a frequency tuning range which includes the frequency bands of the signals applied to switch 14 other than the position 1 band and having a bandwidth of at least 6 MHz in the television tuner application so that it is sufficient to accept the desired input signal. Alternatively, switch 14 may be a two-position switch and the VHF and CATV signals are supplied to the second position thereof, with an additional switch (not shown) preferably utilized for selectively connecting the output of the VHF antenna or CATV cable to the second position of switch 14. The tuning range of tuned RF amplifier 15 by being sufficient to include the frequency band used for the lower frequency R.F. signals applied to the second and third positions of switch 14 thereby also includes the frequency band of the desired IF signals applied to the first position of switch 14 from the output of the first mixer stage 11 and thus obtains dual function of circuit 15 as a UHF IF amplifier and VHF-CATV RF amplifier in the television tuner application of the tuning system. The tuned RF amplifier 15 is a tuned VHF-CATV RF amplifier in that it has a frequency tuning range that covers the VHF and CATV input signals. RF amplifier 15 typically includes three or more tuned frequency selector circuits coupled to one or more solid-state amplifying devices such as the dual-gate FET.

The tuned VHF-CATV RF amplifier 15 is internally switched in accordance with conventional VHF RF amplifier practice for operation either in the VHF low band corresponding to channels 2–6, or the VHF high band corresponding to channels 7–13, the latter band being included within the CATV frequency band. The three tunable circuits 10, 13 and 15 are gang-tuned in order to obtain the correct tracking of the three corresponding tuned circuit systems contained in circuits 10, 13 and 15. Although conventional mechanical tuning capacitors may be utilized in the tuned circuits, it is preferably to use varactors, digital capacitors, or other solid-state means for varying the tuning of circuits 10, 13, 15 so that the tuner may be fabricated as a solid-state component. RF amplifier 15 is connected to a first input of a second mixer circuit 16 which in the television application is identified as the VHF-CATV mixer. The second input to mixer 16 is connected to the fixed end of the selector arm of a two-position second switch 17 having a first position (1) connected to the output of tunable local osciallator 13 and a second position (2) connected to the output of a frequency divider circuit 18 which has its input connected to the output of the tuned local oscillator. Mixer circuit 16 is a conventional circuit typically consisting of one or more bipolar transistors or FETs operating in a nonlinear mixing mode, with a fixed tuned output IF frequency selector circuit. The frequency divider circuit 18 is also a conventional circuit which typically may consist of a transistor flip-flop circuit. In the first position (1) of switch 17, the output of local oscillator 13 is directly connected to mixer 16 and this connection in the television tuner application corresponds to the UHF, CATV or VHF high band mode of operation thereof whereas switch 17 in the second position (2) corresponds to the VHF low band operating mode, and frequency divider 18 provides a divide-by-two function.

The output of second mixer stage 16 includes a desired second IF frequency signal which is selected and amplified by one or more fixed tune stages (not shown) of IF amplification. Thus, it is evident that the highest frequency band RF input signal is applied to the tuned preselector-amplifier circuit 10 and undergoes two frequency conversions in that it is first converted to first IF frequency signal at the output of mixer 11 which, in general, is lower in frequency than the RF input signal, and such first IF signal is converted to a second, and generally lower frequency, IF frequency signal at the output of the second mixer stage 16. The other (lower frequency band) RF input signal(s) are applied to the input of tuned RF amplifier 15 and undergo only a single frequency conversion as in conventional tuning systems. In the specific application of my invention as a multiple frequency band television receiver tuner for UHF, VHF and CATV, the UHF RF input to circuit 10 is presently in the frequency range 470–890 MHz, the VHF low band (channels 2–6) is in the frequency range 54–88 MHz, the VHF high band (channels 7–13) is in the frequency range 174–216 MHz and the CATV input is presently in the frequency range 120–270 MHz. Local oscillator circuit 13 is tunable over a frequency range 166–310 MHz such that the output of the frequency doubler stage 12 is in the range 332–620 MHz of which only the frequency band 344–620 MHz is required for mixing with the UHF band. The output of the frequency divider-(by-two) stage 18 is in the range 83–155 MHz of which only the frequency band 100–128 MHz is required for mixing with the VHF-CATV band frequencies in order to obtain the desired VHF IF frequency band of 40–46 MHz. The tuning range of tunable amplifier 15 is 54–270 MHz to cover the VHF and CATV bands. The output of the UHF mixer stage 11 is in the UHF IF frequency band of 126–270 MHz which is seen to be included within the CATV band thereby permitting dual use of the tuned circuit 15 as a VHF-CATV RF amplifier and as a UHF IF amplifier.

The use of a frequency double circuit 12 and frequency divider-by-two circuit 18 is the preferred approach in obtaining the desired local oscillator frequencies that are applied to the first and second stage mixers 11 and 16, respectively. However, it should be obvious that the desired local oscillator frequencies could also be obtained by substituting a tunable local oscillator having a frequency tuning range of 332–620 MHz for the frequency doubler 12 in FIG. 1, substituting a second frequency divider-by-two circuit for the local oscillator 13 in order to obtain the 166–310 MHz band and the first frequency divider-by-two circuit 18 functioning as it did before. In a second alternative approach for obtaining the desired local oscillator frequencies, a tunable local oscillator having a frequency tuning range of 83–155 MHz is substituted for the frequency divider-by-two circuit 18, a second frequency doubler circuit is substituted for the tuned local oscillator 13 and the first frequency doubler stage 12 functions as it did before. In each of the above two alternatives, the local oscillator would again be only a single oscillator and be non-bandswitched.

Circuit operation of the tuning system illustrated in FIG. 1 with specific application to the television tuner is as follows: In the UHF operating mode, switches 14 and 17 are each in the first position. The signal from the UHF antenna is applied to the UHF preselector 10, which is tuned to the frequency of the particular UHF RF input signal desired to be received, in order to obtain rejection of undesired frequencies. The selected UHF RF signal may also be amplified in circuit 10, if desired. The output of the tuned UHF preselector-amplifier 10 (in the frequency range 470–890 MHz) is applied to the UHF mixer circuit 11 to which is also applied a UHF local oscillator signal tuned to a particular frequency in the range 344–620 MHz to obtain a desired first (the UHF) IF frequency signal in the frequency range 126–270 MHz. This UHF IF signal is preselected and amplified by the tunable RF amplifier 15 which is gang-tuned with local oscillator 13 and UHF preselector 10 (as indicated by the dashed lines). The output of RF amplifier 15 (now operating as a UHF IF amplifier) is applied to the VHF-CATV mixer 16 to which is also applied a VHF-CATV local oscillator signal tuned to a frequency one-half that of the UHF local oscillator frequency. Both the UHF and VHF-CATV local oscillator signals are derived from the same signal source 13. The output of the second mixer 16 (i.e., after the second frequency conversion) includes the fixed second IF (VHF IF) frequency band of 40–46 MHz which is applied to the conventional television IF amplifier stages for further selection and amplification of this desired IF frequency band. The VHF IF frequency band used in the description of my invention is 40–46 MHz, which is slightly different from the standard 41–47 MHz used in present day television receivers. This slight shift in the IF frequency band is made in order to have the various frequency numbers be more conveniently derived and to reduce the required tuning positions, although there is no fundamental reason why the standard 41–47 MHz band could not be retained.

In the VHF high band CATV operating mode, switch 14 is in the second or third position, depending upon whether VHF or CATV is being received from the VHF antenna or CATV cable so that the input signal is applied directly to the input of tunable RF amplifier 15 thereby bypassing the UHF circuits, and switch 17 is in the first position. The tuner system now operates as a single conversion system as in conventional television receivers. Since the VHF high band CATV frequency range of 120–270 MHz is almost identical with the 126–270 MHz frequency range at the UHF mixer 11 output, it is seen that the VHF high band CATV tuner provides the dual function of a tunable VHF-CATV RF amplifier as well as a tunable UHF IF amplifier thereby considerably reducing the tuning requirement of the UHF preselector 10 when my tuner operates in the UHF mode. This feature is especially important since lower frequency (VHF-CATV) tuners have significantly improved selectivity over higher frequency (UHF) tuners.

In the VHF low band operating mode of my television tuning system, switches 14 and 17 are in the second position and the circuit continues operation as a single conversion system. However, the VHF RF amplifier 15 is now internally bandswitched from the VHF high band to the low band in accordance with conventional practice, or a completely separate tunable low band VHF RF amplifier may be switched into the circuit in place of amplifier 15. The latter alternative has several practical advantages in that no tuned circuits are thereby switched and each amplifier can be optimized for its own (VHF high or low band) frequency tuning range. This feature is of significance since the switching of tuned circuits results in the Q being decreased a great amount due to the losses introduced by such switch whereas with separate amplifiers the switching thereof results only in relatively low switching losses. The local oscillator 13 is not internally switched when changing from the VHF high to low band mode of operation, the required VHF low band local oscillator frequency being obtained via switch 17 and the frequency divider 18 connected to the output of oscillator 13 in order to provide the desired local oscillator signal in the frequency range of 100–128 MHz.

Figure 2:
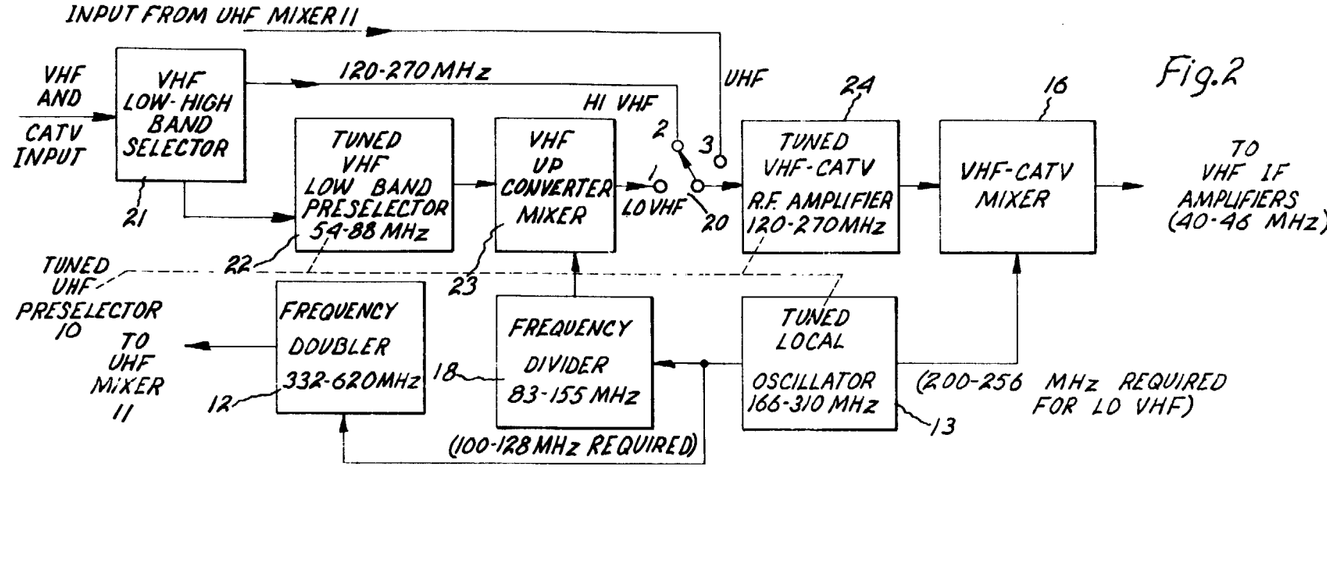
FIG. 2 is a block diagram of a second embodiment of the VHF-CATV band portion of the tuner system in FIG. 1.

Another alternative for the VHF low band operating mode is illustrated in FIG. 2. In this VHF-CATV portion of a second embodiment of my television tuner having the same UHF circuits as illustrated in FIG. 1, a three-position third switch 20 is utilized for selecting the mode of operation of the tuning system wherein position (1) is the VHF low band, position (2) is the VHF high band and CATV, and position (3) is the UHF band selection. The VHF signals from the VHF antenna, or the CATV signals from a CATV cable, are supplied to the input of a suitable filter or two-position selector switch 21 for providing at a first output thereof the VHF low band of 54–88 MHz or at a second output the high VHF and CATV bands of 120–270 MHz. Band selector 21 in the case of a filter would typically be a high pass-low pass cross-over filter of conventional design. The VHF low band signals from the output of band selector 21 are supplied to the input of a simple VHF low band preselector circuit 22 which may be tunable and typically is a single tunable circuit or may be a fixed tuned band pass filter of 54–88 MHz. Preselector 22 provides protection from signals outside the 54–88 MHz frequency band. The output of preselector 22 is applied to the first input of a first VHF mixer circuit 23 and the second input thereto is supplied from the output of the frequency divider (by two) circuit 18 which in turn is supplied from the tuned local oscillator 13 having the same frequency range as in the FIG. 1 embodiment, i.e., 166–310 MHz. As distinguished from all of the other mixer stages herein described, the first VHF mixer 23 is an up-converter in that the upper side band of its output, which is in the frequency range of 154–216 MHz, is selected in a tunable VHF high band CATV RF amplifier 24 that has a frequency tuning range of 120–270 MHz and is gang-tuned with circuits 10, 13 and 22. All of the other mixer circuits 11 and 16 are down-converters in that the lower side bands of their outputs are selected. The output of tuned VHF high band-CATV RF amplifier 24 is applied to a first input of a second VHF-CATV mixer circuit 16 having a second input connected from the output of tuned local oscillator 13. The lower side band of the mixer 16 output is selected in the tuned VHF IF amplifiers (not shown) so that with the required local oscillator signal in the frequency range of 200–256 MHz, the output of VHF-CATV mixer 16 is downconverted to the fixed VHF IF frequency band of 40–46 MHz. The advantage of the FIG. 2 embodiment of my invention is the elimination of band switching internal of the tuned VHF-CATV RF amplifier as is required in circuit 15 in FIG. 1. This elimination of band switching permits design of the tuned RF amplifier 24 so that it can be optimized for one relatively narrow frequency band (120–270 MHz) rather than the two bands (54–88 and 120–270 MHz) or the single broader band (54–270 MHz) as in the case of amplifier 15 in FIG. 1. Thus, tuned amplifier 24 serves a triple duty (tunable UHF IF amplifier, tunable high band VHF-CATV RF amplifier, or tunable low band VHF RF amplifier) in the FIG. 2 embodiment.

In the second (VHF high band) position of switch 20, the VHF high band-CATV signal is passed from the output of band selector 21 to the input of tuned RF amplifier 24, and it is noted that the frequency tuning range of the tuned RF amplifier 24 corresponds to the frequency range of the VHF high band-CATV signals. The VHF high band-CATV signals are then combined in mixer 16 with the output of the local oscillator (tunable over the full oscillator frequency range of 166–310 MHz) in order to obtain at the output thereof the fixed VHF IF frequency band of 40–46 MHz.

In the case of a UHF signal input, switch 20 is in the third (UHF) position and the UHF circuits function in the identical manner as the circuits 10, 11 illustrated in FIG. 1 in that the tuned local oscillator output is passed through a frequency doubler circuit 12 in order to obtain the proper local oscillator frequency at the input to the UHF mixer 11. Thus, the output of the UHF mixer, i.e., the UHF IF signal is again in the range 126–270 MHz which is within the tuning range of tuned RF amplifier 24. And again, as in the case of the FIG. 1 embodiment, the UHF signal undergoes a second frequency conversion upon its passage through the VHF-CATV mixer circuit 16 in order to be converted to the fixed VHF IF frequency band of 40–46 MHz.

The local oscillator in both the FIGS. 1 and 2 embodiments is not bandswitched in order to obtain improved frequency stability. Band switching results in the addition of lossee ($I^2R$) into the tuned circuit of the oscillator thereby decreasing its operating Q and stability. Frequency multiplication and division is an operation external to the oscillator and therefore does not affect the oscillator frequency stability and is thus preferred for obtaining the desired local oscillator frequency bands.

The following table is a partial listing of the local oscillator frequencies used in my tuning system for all of the present day television channels, including VHF, UHF and CATV in the 54–890 MHz range. In the table, the first column designates the representative channels, the second column lists for 6 MHz bandwidths thereof, the third column lists the frequency of local oscillator 13 required for the respective channels and the fourth column lists the actual local oscillator frequency utilized in the first frequency conversion for the respective channels. It should be noted in the table that the listed CATV and VHF high band (channels 7–13) channels have identical local oscillator frequencies in the third and fourth columns, which is to be expected since the output of oscillator 13 is applied directly to mixer 16 in this mode of operation. For the VHF low band (channels 2–6), the oscillator frequencies in the fourth column are one-half that in the third column due to the frequency division step. Finally, for the UHF band, the local oscillator frequencies in the fourth column are twice that in the third column due to the frequency multiplication step. The reduction of required tuning settings resulting from the doubling and tripling (i.e., channels 5, 11, 50 and 6, 13, 56) of channels for some local oscillator frequencies is obvious and this is the reason for using a VHF IF frequency band of 40–46 MHz since the standard IF band of 41–47 MHz would require separate settings for each and every UHF, VHF and CATV channel.

LOCAL OSCILLATOR FREQUENCIES REQUIRED FOR TELEVISION CHANNELS
(40–46 MHz IF Frequency)
(Partial Listing)

| Channel Number | Channel RF Frequency (MHz) | Local Oscillator Frequency (MHz) | Required Local Oscillator Frequency (MHz) |
|---|---|---|---|
| CATV A | 120–126 | 166 | 166 |
| CATV B | 126–132 | 172 | 172 |
| UHF 14 | 470–476 | 172 | 344 |
| UHF 15 | 476–482 | 174 | 348 |
| UHF 16 | 482–488 | 176 | 352 |
| CATV C | 132–138 | 178 | 178 |
| UHF 17 | 488–494 | 178 | 356 |
| UHF 18 | 494–500 | 180 | 360 |
| VHF 2 | 54–60 | 200 | 100 |
| UHF 28 | 554–560 | 200 | 400 |
| CATV G | 156–162 | 202 | 202 |
| UHF 29 | 560–566 | 202 | 404 |
| VHF 7 | 174–180 | 220 | 220 |
| UHF 38 | 614–620 | 220 | 440 |
| UHF 39 | 620–626 | 222 | 444 |
| VHF 4 | 66–72 | 224 | 112 |
| UHF 40 | 626–632 | 224 | 448 |
| VHF 8 | 180–186 | 226 | 226 |
| UHF 41 | 632–638 | 226 | 452 |
| VHF 5 | 76–82 | 244 | 122 |
| VHF 11 | 198–204 | 244 | 244 |
| UHF 50 | 686–692 | 244 | 488 |
| VHF 6 | 82–88 | 256 | 128 |
| VHF 13 | 210–216 | 256 | 256 |
| UHF 56 | 722–728 | 256 | 512 |
| CATV J | 216–222 | 262 | 262 |
| UHF 59 | 740–746 | 262 | 524 |
| CATV R | 264–270 | 310 | 310 |
| UHF 83 | 884–890 | 310 | 620 |

The rule for determining the required local oscillator frequency for a UHF channel is to calculate the required frequency for single conversion operation and then dividing by three. This results in proper signal spectrum inversion at the 40–46 MHz IF frequency. For example, channel 83 has a frequency band of 884–890 MHz, the single conversion local oscillator frequency is 930 MHz, and one third of 930 is 310 MHz which is the required operating frequency of local oscillator 13. The first conversion (i.e., actual) local oscillator frequency utilized at UHF is 310 doubled or 620 MHz.

Required frequency stability of the local oscillator on a percentage basis ($\Delta f/f$ for UHF operation of my tuner system is the same as that of a single conversion UHF oscillator. The local oscillator operates at one third of the local oscillator frequency required in the UHF mixer in the double conversion system, and since electronic tuning elements such as transistors, digital capacitors and other solid state devices exhibit higher Q values at lower frequencies, the local oscillator stability is significantly improved over operation at the required higher local oscillator frequency in a single conversion system.

From the foregoing description, it can be appreciated that my invention attains the objectives set forth in that it provides an improved multiple frequency band receiver tuner system utilizing a single non-bandswitched local oscillator and a double frequency conversion mode of operation for at least one band of signal frequencies. The double conversion mode of operation permits operation of the local oscillator at a much lower frequency wherein the Q requirements are not nearly as high as for operation at a higher local oscillator frequency if only single conversion was utilized. This reduced Q requirement in the high frequency portion of the tuning system renders the tuner practical for use with electronic tuning devices so that the tuner may be fabricated as a solid-state component. In the specific application of the tuning system as a television tuner, the tuner operates as a double conversion receiver at UHF frequencies with both the UHF RF and VHF RF frequencies being tunable to thereby minimize spurious signal interference problems inherent in conventional double conversion systems and also simplifying the local oscillator circuitry. The dual use of the VHF RF amplifier as a tunable UHF IF amplifier in the double conversion mode of operation results in an all frequency television tuner fabricated of a minimum of components and yet having superior operating characteristics as compared to conventional all frequency television tuners using solid state tuning.

Having described several embodiments of my tuner, it is believed obvious that my invention is appropriate to other multiple frequency band receiver tuner systems besides the television receiver. The various preselector, amplifier, mixer, oscillator, and frequency multiplier and divider circuits may be of any conventional type other than that described. And additional stages of frequency multiplication or division may be utilized in order to obtain the required local oscillator frequency as a particular harmonic or subharmonic of the local oscillator 3 frequency. It is, therefore, to be understood that changes may be made in the particular embodiments of my invention described which are within the full intended scope of the invention as defined by the following claims.

What I claim as new and desire to secure by Letters Patent of the United States is:

1. A multiple frequency band receiver tuner system comprising
    a first mixer circuit having a first input adapted to be connected to a first source of received radio frequency signals in a first frequency band,
    a first radio frequency amplifier circuit tunable over a second frequency band,
    a single non-bandswitched local oscillator circuit tunable over a selected third frequency band for generating a fixed frequency radio frequency signal and being gangtuned with said first amplifier, said first mixer having a second input in communication with an output of said local oscillator so that a first intermediate frequency signal in a fourth frequency band is developed at an output of said first mixer,
    first switch means connected between the output of said first mixer and an input to said first amplifier for selectively connecting the input of said first amplifier to the output of said first mixer in a first operating mode of said first switch means, and for connecting the input of said first amplifier to a second source of received radio frequency signals in a fifth frequency band which provides separate signals in at least two separate portions of said fifth frequency band in a second operating mode,
    a second mixer circuit having a first input connected to an output of said first amplifier and a second input in communication with the output of said local oscillator so that a second intermediate frequency signal in a sixth frequency band is developed at an output of said second mixer, and
    means connected between the output of said local oscillator and at least one of the second inputs to said first and second mixers for changing the local oscillator frequency applied thereto by at least a factor of two so that the local oscillator frequency signals applied to said first and second mixers differ in frequency by at least a factor of two,
    second switch means interconnected between the output of said local oscillator and an output of said local oscillator frequency changing means and the second input of said second mixer for selectively connecting the second input of said second mixer to the output of said local oscillator in a first operating mode of said second switch means when a radio frequency signal in a first of at least two separate portions of the fifth frequency band is being received, and for connecting the second input of said second mixer to an output of said local oscillator frequency changing means in a second operating mode of said second switch means when a radio frequency signal in a second of the at least two separate portions of the fifth frequency band is being received,
    the second frequency band including the fourth frequency band so that said first amplifier provides a dual function as a tunable radio frequency amplifier for the received signals in the fifth frequency band in the second operating mode of said first switch means, and as a tunable intermediate frequency amplifier for the signals in the fourth frequency band in the first operating mode of said switch means, and said tuner system therefore operates in a single frequency conversion mode with said first switch means in the second operating mode and in a double frequency conversion mode with said first switch means in the first operating mode.

2. The multiple frequency band receiver tuner system set forth in claim 1 and further comprising
    a preselector circuit gang-tuned with said local oscillator and first amplifier and being tunable over the first frequency band, said preselector having an input connected to the first source of received radio frequency signals, and an output connected to the first input of said first mixer.

3. The multiple frequency band receiver tuner system set forth in claim 2 and further comprising
    a second radio frequency amplifier circuit having an input connected to an output of said preselector and an output connected to the first input of said first mixer, said second amplifier having a frequency range including the first frequency band.

4. The multiple frequency band receiver tuner system set forth in claim 3 wherein
    said preselector and second amplifier form an integral circuit so that said second amplifier is also tunable over the first frequency band and gangtuned with said local oscillator and first amplifier.

5. The multiple frequency band receiver tuner system set forth in claim 3 wherein
    said preselector and second amplifier are separate circuits and said second amplifier is of the broad band nontunable type.

6. The multiple frequency band receiver tuner system set forth in claim 1 wherein
    the first of the at least two separate portions of the fifth frequency band is an upper frequency portion thereof, and the second portion is a lower frequency portion thereof, and said second switch means having a first input connected to the output of said local oscillator, a second input connected to an output of said local oscillator frequency changing means, and an output connected to the second input of said second mixer.

7. The multiple frequency band receiver tuner system set forth in claim 6 wherein
said local oscillator frequency changing means comprises
a frequency multiplier circuit having an input connected to the output of said local oscillator, and an output connected to the second input of said first mixer so that with said first and second switch means each in the first operating mode a corresponding harmonic of the local oscillator frequency is applied to said first mixer and the fundamental frequency is applied to said second mixer when the radio frequency signals in the first frequency band are being received,
with said first and second switch means respectively in the second and first operating modes the fundamental frequency of the local oscillator is applied to said second mixer when the radio frequency signals in the upper frequency portion of the fifth frequency band are being received, and
a frequency divider circuit having an input connected to the output of said local oscillator, and an output connected to the second input of said second switch means so that with said first and second switch means, each in the second operating mode, a corresponding subharmonic of the local oscillator frequency is applied to said second mixer when the radio frequency signals in the lower frequency portion of the fifth frequency band are being received.

8. The multiple frequency band receiver tuner system set forth in claim 1 wherein
the second source of received radio frequency signals in the fifth frequency band provides separate signals in at least two separate portions of the fifth frequency band,
and further comprising
frequency band selector means having an input connected to the second source of received radio frequency signals in the fifth frequency band, a first output selectively providing the received radio frequency signals in a first portion of the at least two separate portions of the fifth frequency band, and a second output selectively providing the received radio frequency signals in a second portion of the fifth frequency band,
a preselector circuit gang-tuned with said local oscillator and first amplifier and being tunable over the first portion of the fifth frequency band, said preselector having an input connected to the first output of said frequency band selector means, and
a third mixer circuit having a first input connected to an output of said preselector circuit, and a second input connected to an output of said local oscillator frequency changing means,
said first switch means having a first input connected to the output of said first mixer corresponding to the first operating mode of said first switch means, and having a second input connected to the second output of said frequency band selector means corresponding to a second operating mode for receiving the radio frequency signals in the second portion of the fifth frequency band, and having a third input connected to an output of said third mixer corresponding to a third operating mode for receiving the radio frequency signals in the first portion of the fifth frequency band, and having an output connected to the input of said tunable first amplifier,
the tunable frequency range of said first amplifier including the upper sideband of the output of said third mixer so that said third mixer functions as an up-converter mixer and said first amplifier provides a triple function as a tunable radio frequency amplifier for the received signals in the second portion of the fifth frequency band in the second operating mode of said first switch means, as a tunable intermediate frequency amplifier for the signals in the fourth frequency band in the first operating mode, and as a tunable intermediate frequency amplifier for the received signals in the first portion of the fifth frequency band in the third operating mode, and said tuner system therefore operates in a single frequency conversion mode with said first switch means in the second operating mode and in double frequency conversion modes with said first switch means in the first and third operating modes.

9. The multiple frequency band receiver tuner system set forth in claim 8 wherein
said local oscillator frequency changing means comprises
a frequency doubler circuit having an input connected to the output of said local oscillator, and an output connected to the second input of said first mixer, and
a frequency divider-by-two circuit having an input connected to the output of said local oscillator, and an output connected to the second input of said third mixer so that the fundamental frequency of the local oscillator is applied to said second mixer, the second harmonic thereof is applied to said first mixer, and half the fundamental frequency is applied to said third mixer.

10. A multiple frequency band television receiver tuner system adapted for UHF, VHF and CATV bands and comprising
a UHF mixer circuit having a first input adapted to be connected to a UHF antenna for receiving radio frequency signals in the UHF frequency band,
a first radio frequency amplifier circuit tunable over a second frequency band,
a single non-bandswitched local oscillator circuit tunable over a selected third frequency band for generating a fixed frequency radio frequency signal and being gang-tuned with said first amplifier, said UHF mixer having a second input in communication with an output of said local oscillator so that a first intermediate frequency signal in a fourth frequency band of approximately 126–270 MHz is developed at an output of said UHF mixer,
a frequency doubler circuit having an input connected to the output of said local oscillator, and an output connected to the second input of said UHF mixer so that the second harmonic of the local oscillator frequency is applied to said UHF mixer,
first switch means connected between the output of said UHF mixer and an input to said first amplifier for selectively connecting the input of said first amplifier to the output of said UHF mixer in a first operating mode of said first switch means, and for connecting the input of said first amplifier to a second source of received radio frequency signals which include the VHF and CATV frequency bands in a second operating mode, a VHF-CATV mixer circuit having a first input connected to an output of said first amplifier and a second input in communication with the output of said local oscillator so that a second intermediate frequency signal in a frequency band of approximately 40–46 MHz is developed at an output of said VHF-CATV mixer, a frequency divider-by-two circuit having an input connected to the output of said local oscillator, and an output connected to the second input of said VHF-CATV mixer so that half the fundamental frequency of the local oscillator is applied to said second mixer, and the second frequency band including the fourth frequency band so that said first amplifier provides a dual function as a tunable VHF and CATV RF amplifier in the second operating mode of said first switch means, and as a tunable UHF IF amplifier in the first operating mode of said first switch means, and said tuner system therefore operates as a single frequency conversion mode VHF-CATV tuner with said first switch means in the second operating mode and as a double frequency conversion mode UHF tuner with said first switch means in the first operating mode.

11. The multiple frequency band television receiver tuner system set forth in claim 10 and further comprising a preselector circuit gang-tuned with said local oscillator and first amplifier and being tunable over the UHF frequency band, said preselector having an input connected to the UHF antenna, and an output connected to the first input of said UHF mixer.

12. The multiple frequency band television receiver tuner system set forth in claim 11 and further comprising a second radio frequency amplifier circuit having an input connected to an output of said UHF preselector and an output connected to the first input of said UHF mixer, said second amplifier having a frequency range including the UHF frequency band.

13. The multiple frequency band television receiver tuner system set forth in claim 12 wherein said UHF preselector and second amplifier form an integral circuit so that said second amplifier is also tunable over the UHF frequency band and gang-tuned with said local oscillator and first amplifier.

14. The multiple frequency band television receiver tuner system set forth in claim 12 wherein said UHF preselector and second amplifier are separate circuits and said second amplifier is of the broad band nontunable type.

15. The multiple frequency band television receiver tuner system set forth in claim 10 wherein the second source of received radio frequency signals provides radio frequency signals in the VHF high band, VHF low band and CATV frequency bands, and further comprising second switch means having a first operating mode input connected to the output of said local oscillator, and a second operating mode input connected to the output of said frequency divider-by-two circuit, and an output connected to the second input of said VHF-CATV mixer for selectively connecting the second input of said VHF-CATV mixer to the output of said local oscillator in the first operating mode of said second switch means when a radio frequency signal in the UHF, VHF high band or CATV band is being received, and for connecting the second input of said VHF-CATV mixer to the output of said frequency divider-by-two circuit in the second operating mode of said second switch means when a radio frequency signal in the VHF low band is being received so that the local oscillator frequency signals applied to said VHF-CATV mixer differ in frequency by a factor of two between the first and second operating modes of said second switch means, said first amplifier having a frequency tuning range of approximately 54–270 MHz which includes the VHF and CATV frequency bands.

16. The multiple frequency band television receiver tuner system set forth in claim 10 and further comprising frequency band selector means having an input connected to the second source of received radio frequency signals in the VHF and CATV frequency bands, a first output selectively providing the received radio frequency signals in the VHF low frequency band, and a second output selectively providing the received radio frequency signals in the VHF high band and CATV frequency bands, a preselector circuit gang-tuned with said local oscillator and first amplifier and being tunable over the VHF low frequency band, said preselector having an input connected to the first output of said frequency band selector means, and a third mixer circuit having a first input connected to an output of said preselector circuit, and a second input connected to an output of said local oscillator frequency changing means, said first switch means having a first input connected to the output of said UHF mixer corresponding to the first operating mode of said first switch means, and having a second input connected to the second output of said frequency band selector means corresponding to a second operating mode for receiving the radio frequency signals in the VHF high band and CATV frequency bands, and having a third input connected to an output of said third mixer corresponding to a third operating mode for receiving the radio frequency signals in the VHF low frequency band, and having an output connected to the input of said tunable first amplifier, the tunable frequency range of said first amplifier including the upper sideband of the output of said third mixer so that said third mixer functions as an up-converter mixer and said first amplifier provides a triple function as a tunable VHF high band and CATV RF amplifier in the second operating mode of said first switch means, as a tunable UHF IF amplifier in the first operating mode, and as a tunable VHF low band IF amplifier in the third operating mode, and said tuner system therefore operates in a single frequency conversion mode with said first switch means in the second operating mode and in double frequency conversion modes with said first switch means in the first and third operating modes.

17. The multiple frequency band television receiver tuner system set forth in claim 16 wherein
said local oscillator frequency changing means comprises
a frequency doubler circuit having an input connected to the output of said local oscillator, and an output connected to the second input of said UHF mixer, and
a frequency divider-by-two circuit having an input connected to the output of said local oscillator, and an output connected to the second input of said third mixer so that the fundamental frequency of the local oscillator is applied to said VHF-CATV mixer, the second harmonic thereof is applied to said UHF mixer, and half the fundamental frequency is applied to said third mixer,
said first amplifier having a frequency tuning range of approximately 120–270 MHz which includes the VHF high band and CATV frequency bands.

18. A multiple frequency band television receiver tuner system adapted for UHF, VHF and CATV bands comprising:
a UHF mixer circuit having a first input connectable to a source of UHF television signals in a first frequency band;
a VHF-CATV mixer having a first input;
a second input connectable to a source of VHF-CATV television signals in a second frequency band;
switch means operative to connect said first input of said VHF-CATV mixer alternately to said second input or to an output of said UHF mixer;
local oscillator circuit means tunable over a third frequency band and having a first output in a first output frequency band and a second output in a second output frequency band, said second output frequency band being double said first output frequency band;
said first output of said local oscillator circuit means connected to a second input of said VHF-CATV mixer and said second output connected to a second input of said UHF mixer;
said first output frequency band selected so that the output of said UHF mixer circuit is characterized by television signals in a frequency band substantially coextensive with said second frequency band.

19. The television tuner of claim 18 further comprising a tuned radio frequency amplifier tunable over the frequency range including said VHF-CATV frequency band connected between said VHF-CATV mixer and said switch means so that in a first mode said tuned radio frequency amplifier functions as a tunable intermediate frequency amplifier connected between said UHF mixer and said VHF-CATV mixer, and in a second mode functions as a first stage radio frequency amplifier at said VHF-CATV frequency bands.

20. A multiple frequency band television receiver tuner system adapted for UHF, VHF and CATV bands comprising:
a UHF mixer circuit having a first input connectable to a source of UHF television signals in a first frequency band;
a VHF-CATV mixer having a first input;
a second input connectable to a source of VHF-CATV television signals in a second frequency band;
switch means operative to connect said first input of said VHF-CATV mixer alternately to said second input or to an output of said UHF mixer;
local oscillator circuit means suitable over a third frequency band and having a first output in a first output frequency band and a second output in a second output frequency band, said second output frequency band being double said first output frequency band;
said first output of said local oscillator circuit means connected to a second input of said VHF-CATV mixer and said second output connected to a second input of said UHF mixer;
said local oscillator circuit means further including a third output and a third output frequency band characterized by a frequency one-half that of said first output frequency band; and
second switch means connecting said second input of said VHF-CATV mixer alternatively with said first or third outputs of said local oscillator circuit means.

21. The television tuner of claim 20 further comprising a tuned radio frequency amplifier tunable over the frequency range including said VHF-CATV frequency band connected between said VHF-CATV mixer and said switch means so that in a first mode said tuned radio frequency amplifier functions as a tunable intermediate frequency amplifier connected between said UHF mixer and said VHF-CATV mixer, and in a second mode functions as a first stage radio frequency amplifier at said VHF-CATV frequency band.

* * * * *